United States Patent [19]

Schmitz et al.

[11] Patent Number: 5,831,809
[45] Date of Patent: Nov. 3, 1998

[54] METHOD FOR CONTROLLING AN ELECTROMAGNETIC ACTUATOR WITH COMPENSATION FOR CHANGES IN OHMIC RESISTANCE OF THE ELECTROMAGNET COIL

[75] Inventors: Guenter Schmitz; Ekkehard Schrey, both of Aachen, Germany

[73] Assignee: FEV Motorentechnik GmbH & Co. KG, Aachen, Germany

[21] Appl. No.: 706,453

[22] Filed: Sep. 4, 1996

[30] Foreign Application Priority Data

Sep. 9, 1995 [DE] Germany .................. 195 33 452.3

[51] Int. Cl.[6] ..................................................... H01H 47/00
[52] U.S. Cl. ............................................................. 361/154
[58] Field of Search .................................. 361/152, 154, 361/187, 194, 195, 156, 179, 205, 170; 123/490

[56] References Cited

U.S. PATENT DOCUMENTS 5,131,624  7/1992  Kreuter et al. ........................ 335/266
5,442,515  8/1995  Wallaert ................................ 361/187

Primary Examiner—Ronald W. Leja
Attorney, Agent, or Firm—Spencer & Frank

[57] ABSTRACT

A method is provided for controlling an electromagnetic actuator having an electromagnet including a magnetic core presenting a pole face and an electromagnet coil wound around the magnetic core, a return spring and an armature connected to an actuation mechanism and movable toward the pole face by a magnetic force of the electromagnet against the force of the return spring. The method includes: detecting a time behavior and/or value of current and/or voltage present at the electromagnet coil during a time period when the armature does not move relative to the electromagnet, and deriving a value corresponding to the actual ohmic resistance and/or inductance of the electromagnet coil from the detected time behavior and/or value from the detecting step for compensating changes in the ohmic resistance of the electromagnet coil.

2 Claims, 7 Drawing Sheets

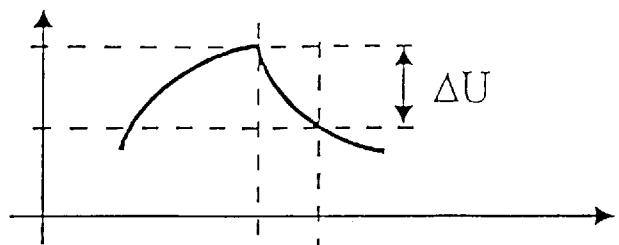
FIG. 4.1
voltage at point 19
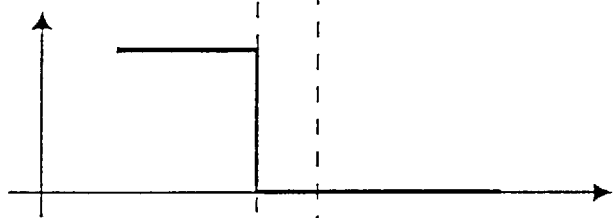
FIG. 4.2
voltage at 21
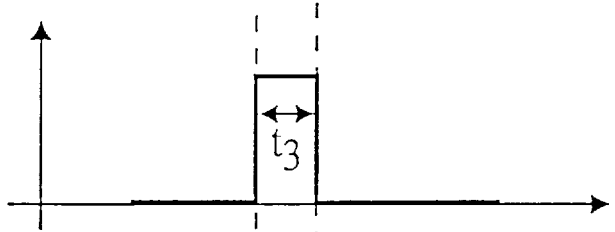
FIG. 4.3
voltage at 25
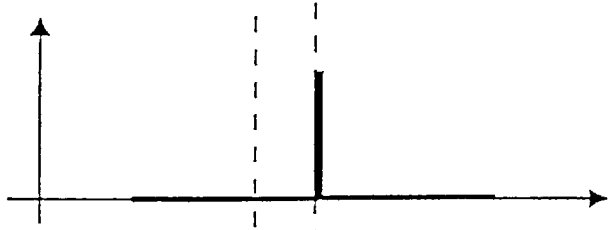
FIG. 4.4
voltage at 27
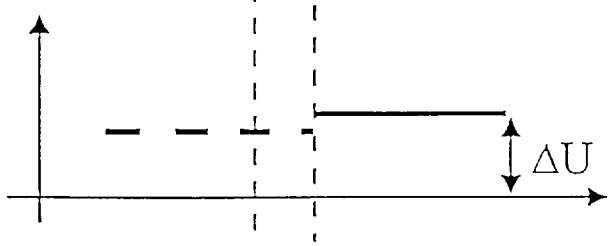
FIG. 4.5
output voltage 29

METHOD FOR CONTROLLING AN ELECTROMAGNETIC ACTUATOR WITH COMPENSATION FOR CHANGES IN OHMIC RESISTANCE OF THE ELECTROMAGNET COIL

CROSS-REFERENCE TO RELATED APPLICATIONS

This application claims the right of priority of application DE 195 33 452.3 filed in Germany on Sep. 9, 1995, the disclosure of which is incorporated herein by reference.

BACKGROUND OF THE INVENTION

With electromagnetic actuators, especially electromagnetic actuators for actuating cylinder valves of internal combustion engines, there is frequently the requirement of realizing high switching speeds with simultaneously high switching forces. Such an electromagnetic actuator has at least one electromagnet, which can be used to move an armature connected to an actuating means against the force of at least one return spring. An electromagnetic actuator for actuating a cylinder valve has two electromagnets between which the armature, which is connected to the valve, can be moved against the force, respectively, of the return springs, from the closed position to the open position and in the reverse order.

In order to actuate such an electromagnetic actuator, the electromagnet is energized with current so that the armature is attracted to one of the electromagnets and held in position at that electromagnet for a predetermined time. If the actuation means, for example, cylinder valve stem, which is fixed to the armature, must be moved to a different position, the holding current at the holding electromagnet is turned off. As a result of this, the retention force of the holding electromagnet drops below that of the return spring force and the armature starts to move, accelerated by the spring force, and reaches another position. If the above-mentioned actuator has two electromagnets, the armature adjoins one or the other of the electromagnets at each operating position. The holding current at the holding electromagnet is turned off for each actuation. Following the transit of the armature through a resting position, which is predetermined by the return springs, the "flight" of the armature is slowed by the spring force corresponding to the capturing electromagnet. In order to capture the armature in the other position and keep it there, the capturing electromagnet is energized with a respective amount of current.

The energization of the capturing electromagnet with power must be initiated at a defined point in time following the current cut-off at the holding electromagnet. As a result of the inductive behavior of the electromagnet coils, the current flowing through the coil of the capturing electromagnet builds up slowly at first. If the current is switched on too late, then the current level reached during the armature approach to the capturing electromagnet is not sufficient to capture the armature with certainty. If the current is switched on too early, this leads to higher losses and to a higher energy input to the armature, so that it hits the pole face too hard. In addition to high wear and noise problems, this can also result in so-called rebounding occurrences, wherein the armature can rebound completely from the pole face.

The respectively "right" time for switching on the capturing electromagnet depends in each case on the rise in the current flow curve, which in turn depends on the inductance of the coil, the ohmic resistance of the coil for the respective electromagnet and the supply voltage to the coil. As a rule, the inductance and supply voltage parameters can be kept constant during operations. However, the resistance of the electromagnet coil depends on temperature. The resistance of the coil increases with a rise in temperature in the electromagnet and decreases with a respective drop in temperature of the electromagnet, so that the actuation of such an electromagnetic actuator must be adjusted correspondingly. Taking a measurement of the respective operating temperature at the electromagnets for the electromagnetic actuator with a separate temperature sensor is too expensive, so that other solutions must be sought.

German patent publication DE-A-35 43 017 discloses an electromagnetic actuator for actuating a cylinder valve which is designed to measure the speed at which the current rises at the capturing electromagnet during the armature flight phase and to derive from this measurement correction values for subsequent operating cycles. This method of operation is not totally satisfactory because the course of movement of the approaching armature, which is conditioned by the induced voltages and changing inductance, and the respectively present supply voltage together have an effect on the speed at which the current rises. The supply voltage and course of movement of the armature, however, can vary from one operational cycle to the next. The supply voltage changes, especially during the start-up operation, and the armature movements differ due to cyclical fluctuations caused by the system operation, for example those fluctuations caused by the changing exhaust gas back pressure. The speed at which the current rises for the respectively preceding operational cycle, consequently, does not represent a reliable measure for deriving corrections for the following operational cycle.

SUMMARY OF THE INVENTION

It is an object of the invention to find a method for adapting a control for an electromagnetic actuator which leads to more reliable correction values as compared to methods currently in use.

The above and other objects are accomplished according to the invention by the provision of a method for controlling an electromagnetic actuator having an electromagnet including a magnetic core presenting a pole face and an electromagnet coil wound around the magnetic core, a return spring and an armature connected to an actuation mechanism and movable toward the pole face by a magnetic force of the electromagnet against the force of the return spring, comprising the steps of: detecting one of a time behavior and value, of at least one for current and voltage present at the electromagnet coil during a time period when the armature does not move relative to the electromagnet; and deriving a value corresponding to at least one of actual ohmic resistance and inductance of the electromagnet coil from the detected one of the time behavior and value of the detecting step for use in compensating changes in the ohmic resistance of the electromagnet.

This method has the advantage of eliminating the influence of the armature movement on the detection of the correction data, so that respective correction data can be obtained only by collecting current and/or voltage values. The information obtained in this way can then be evaluated. It is particularly useful if, based on the derived operational value, the control of the electromagnetic actuator is corrected with respect to points in time for switching and/or current level and/or current rise and/or voltage level and/or voltage rise.

The term "ohmic resistance of the electromagnet" refers to the ohmic resistance of the electromagnet coil. The goal is to detect changes in the ohmic resistance as they occur, for example, as a result of temperature changes. Based on these changes, a control can then be corrected. Depending on the number of unknown values, meaning voltage, inductance and ohmic resistance, a corresponding number of parameters are measured, into which these unknown values enter each time in different ways.

In order to reduce the number of parameters that must be measured, if possible, it is proposed according to one exemplary embodiment of the inventive method that during one operational phase, in which the armature is held by a holding current clocked between a lower threshold $I_{min}$ and an upper threshold $I_{max}$, the drop time for the current dropping from $I_{max}$ to $I_{min}$ is measured at least once during this phase and that the ohmic resistance of the electromagnet is derived from that measurement. During the interval when the current drops, only the values of inductance and ohmic resistance are effective. Because the inductance as a rule is known from the design data, it is possible to immediately derive the ohmic resistance.

In another aspect of the method according to the invention, if it is necessary in connection with the above-described method, during the period when the armature is released by turning off the holding current, the switch-on voltage and/or the time behavior of voltage and current drop after the current is turned off is detected and the inductance of the electromagnet derived from these detected values. Here again, it is possible to derive the ohmic resistance through a corresponding arithmetical operation, based on the other parameters that can be measured, and to generate from the derived value a respective correction value for the control of the electromagnetic actuator for compensating the temperature condition.

In another embodiment of the method according to the invention, during an operational period when the armature is in a resting position relative to the electromagnet, the electromagnet is energized with a constant current, the voltage at the electromagnet coil is measured and the actual ohmic resistance derived from this. This action can take place during the holding phase, wherein it is necessary, however, to change from a clocked holding current to a constant holding current via a linear control. As a result, a voltage proportional to the ohmic resistance develops immediately at the electromagnet coil, which can be used to derive a correction value for the actual ohmic resistance caused by the operational temperature.

For an electromagnetic actuator with one electromagnet as well as an electromagnetic actuator with two electromagnets that alternately affect the armature, the ohmic resistance can be detected by energizing with a constant current, even if the armature is in the resting position relative to the electromagnet to be measured respectively, but does not abut against it. In that case, the electromagnet is energized each time with a defined holding current, so that a voltage proportional to the ohmic resistance can be detected from this and the actual ohmic resistance, caused by the operating temperature, can be detected and a correction value for the control derived.

According to one advantageous embodiment, during an operational period when the armature is in a resting position relative to the electromagnet, but does not abut against it, the voltage generated through an energization with constant current is stored temporarily via a capacitor and is used for temperature compensation of the control.

The invention is explained in greater detail below with the aid of drawings.

BRIEF DESCRIPTION OF THE DRAWINGS

FIGS. 4.1 to 4.5 show the chronological order of the respectively measured circuit voltages according to FIG. 2.

DETAILED DESCRIPTION OF THE PREFERRED EMBODIMENTS

Figure 1:
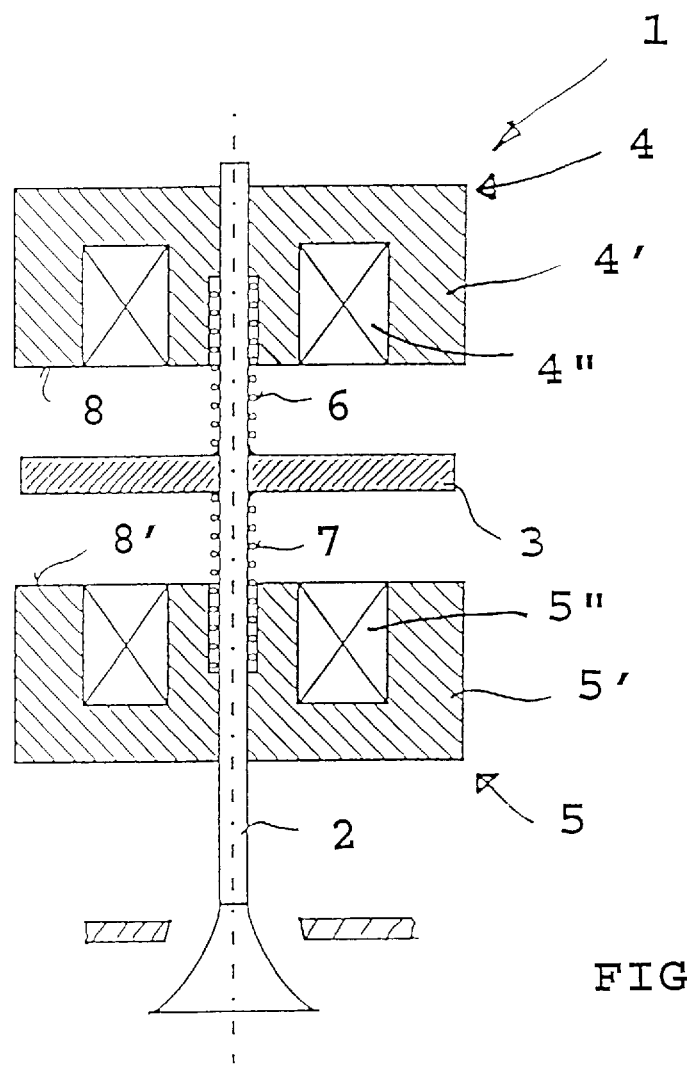
FIG. 1 is longitudinal cross section of an electromagnetic actuator for a cylinder valve with which the method of the invention can be implemented.

Referring to FIG. 1, there is shown an electromagnetic actuator 1 with an armature 3 that is connected to a cylinder valve stem 2 of a cylinder valve (not shown) and movable between a closing electromagnet 4 and an opening electromagnet 5. Closing electromagnet 4 includes a magnetic core 4' presenting a pole face 8 and being wound by an electromagnet coil 4". Opening electromagnet 5 includes a magnetic core 5' presenting a pole face 8' and being wound by an electromagnet coil 5". If the electromagnets are not under power, armature 3 is maintained in a resting position between the two electromagnets 4 and 5 with the aid of return springs 6 and 7. The respective distances of armature 3 in its resting position to pole faces 8, 8' of electromagnets 4, 5 depend on the design of springs 6 and 7. In an exemplary embodiment as shown in FIG. 1, the two springs 6 and 7 have identical designs, so that the resting position for armature 3 is in the middle between the two pole faces 8 and 8'. In a closed position of the cylinder valve, armature 3 fits flush against pole face 8 of closing electromagnet 4.

In order to actuate the cylinder valve, that is, to start the movement from the closed position to the opened position, the holding current at closing electromagnet 4 is turned off, causing the retaining force of closing electromagnet 4 to drop below the spring force of return spring 6. As a result, armature 3 starts to move, accelerated by the spring force. After armature 3 passes through its resting position, the "flight" of the armature is slowed by the spring force of return spring 7, which is coordinated with opening electromagnet 5. In order to capture armature 3 in the opening position and keep it there, opening electromagnet 5 is energized with current. The direction of the switching and movement sequence is reversed for the closing of the cylinder valve.

Figure 2:
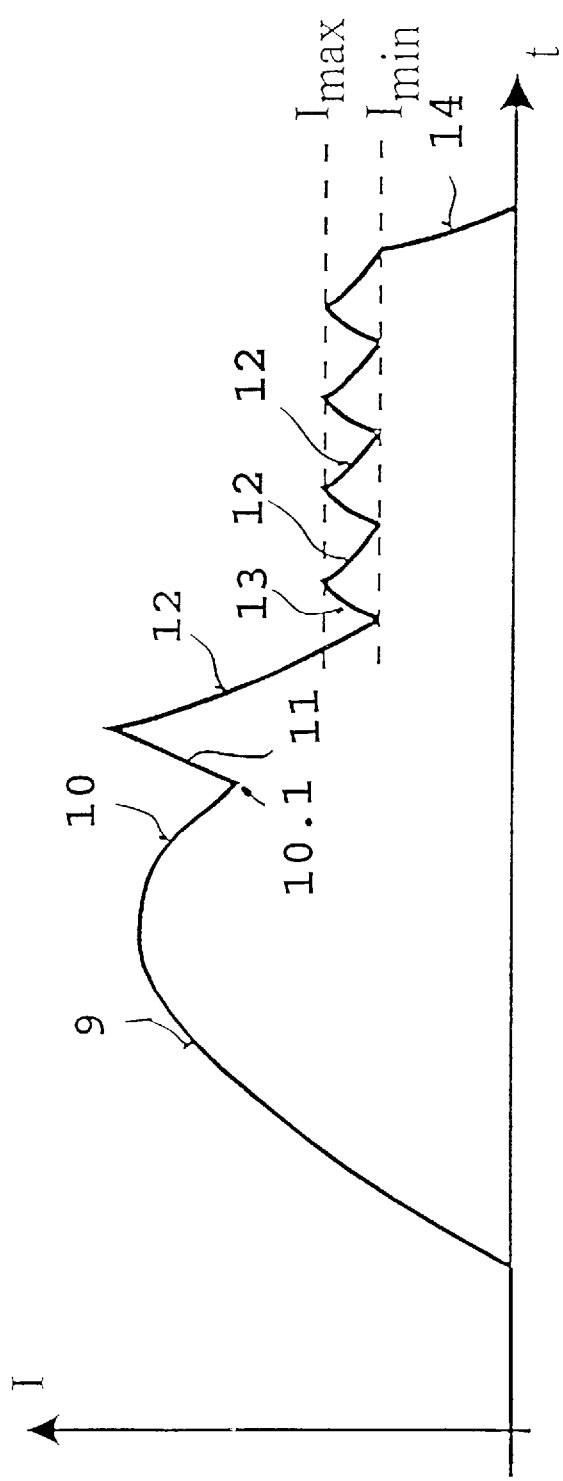
FIG. 2 is a diagram showing the time behavior of a current at an electromagnet during capturing, holding and release of the armature.

FIG. 2 shows the flow of current at a capturing electromagnet over the total period of time, extending from a capturing and holding of the armature to its release. As can be seen in FIG. 2, the current initially rises in accordance with an e-function (curve segment 9) and then drops as a result of the countervoltage (curve segment 10) which is induced by the approaching armature. Once the armature impacts, the current reaches a minimum at point 10.1 and subsequently starts to rise again (curve segment 11) because the countervoltage is no longer produced.

While a relatively high level of current is necessary to capture the armature, such a current level is not necessary to hold the armature if the maximum current value reached after the rise in curve segment 11 is sufficient to make the armature adhere with certainty. The current is subsequently adjusted to lower levels. The adjustment to the lower current level is done for reasons of energy conservation and is effected for the most part through a clocking control. In particular, the current is conducted through a freewheeling component, for example a freewheeling diode, as long as the current level stays above a certain threshold value so that no current from the main supply system is needed while the current is above the threshold. As a result of the ohmic losses, the current drops exponentially during this switching (curve segment 12). The electromagnet is supplied by the supply voltage only after the current level drops below a certain predetermined threshold $I_{min}$, so that the coil current rises once more (curve segment 13). The step of supplying the electromagnet coil with current is stopped again after a certain predetermined time or after reaching a certain current level $I_{max}$, so that the process of a current drop starts anew. In this so-called holding phase, the current is clocked in the above-described manner for the duration of the predetermined time interval, during which the armature abuts against the pole face of the holding electromagnet, and the current consumption is thus reduced during the holding phase.

In the current drop phases as shown in curve segments 12 of FIG. 2, the drop occurs without the influence of the supply voltage, so that the ohmic resistance can be deduced directly from the drop speed or drop time, insofar as the inductance of the holding electromagnet is known because the inductance is decisive for the drop speed along with the ohmic resistance.

If the inductance is not known, it can be determined, for example, in the last phase of placing the electromagnet under current (curve segment 14). In this last phase, which must lead to the release of the armature from the holding electromagnet, it is desirable to have a current drop as steeply as possible as this will achieve an easily reproducible dropping of the armature from the pole face of the electromagnet. For that reason, the current is no longer conducted through a freewheeling component during shut-off. Rather, an attempt is made to achieve the highest possible shut-down voltage. The inductance can then be determined from a resulting shut-down voltage or, especially in the case of a preset voltage limit, from the time behavior of the voltage drop or even the current drop.

It follows from the preceding that the ohmic resistance of the electromagnet can be detected during respective current phases, and, if necessary, the inductance, if it is not known, can be obtained and a signal can then be sent directly to the control of the electromagnetic actuator by establishing a corresponding connection. The actual ohmic resistance value for the electromagnet is compared to a predetermined set value and if a change has occurred as a result of temperature changes, and in particular temperature increases, a correction signal is generated. Through a corresponding shifting of the switching times or a change in the current level at the time when the armature is captured (curve segments 9, 10, 10.1) as well as during the holding phase, this temperature-dependent change can be corrected via the control for subsequent operating cycles.

Figure 3:
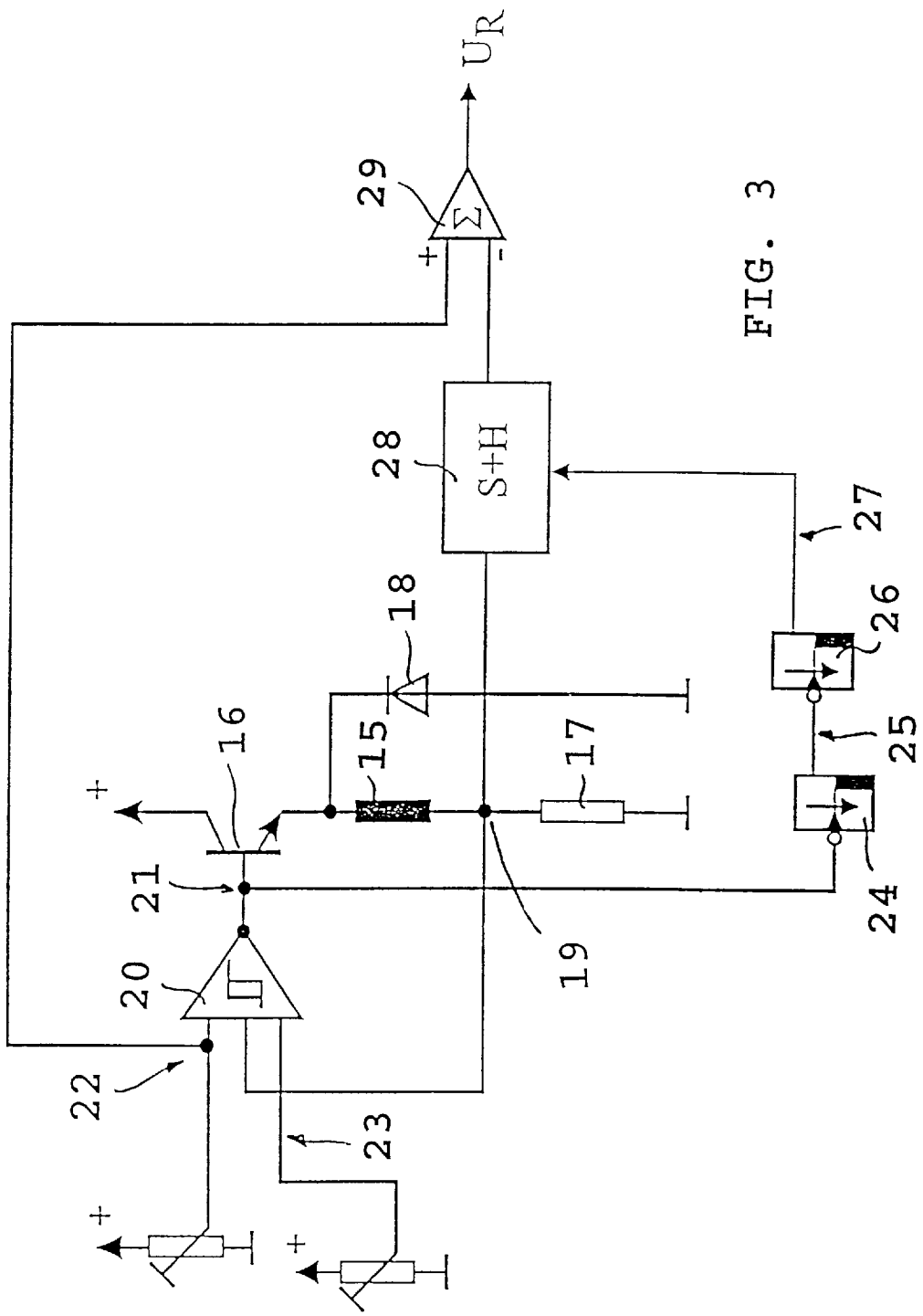
FIG. 3 is a circuit schematic for carrying out an operation according to the method of the invention.

A corresponding correction method is described in FIG. 3 with the aid of a circuit schematic. During the current clocking in the holding phase, in particular, curve segments 12 in FIG. 2, the current in the freewheeling phase drops according to an e-function, based on the formula $I=I_1 \cdot e^{-t/T}$ with $T=L/R$, provided time $t=0$ is viewed as starting with the switching to the freewheeling operation and $I_1$ is applied at this time. Following a certain time interval $t_3$, a current $I_3 = I_1 \cdot e^{-t_3/T}$ results, meaning the current has changed by $\Delta I = I_1 - I_1 \cdot e^{-t_3/T}$. For relatively short periods of time or small current changes, the approximation $\Delta I = I_1 \cdot t_3/T$ (termination of Taylor's series after linear term) can therefore be applied. That corresponds to $\Delta I = I_1 \cdot t_3 \cdot 1/L \cdot R$. Thus, the ohmic resistance can be determined as $R = \Delta I/I_1 \cdot L/t_3$, if values $I_1$, $t_3$ and $L$ are fixed.

FIG. 3 shows a circuit for realizing this method. Only a portion of the complete circuit is shown, the portion that is necessary for generating the clocking as well as for determining the voltage proportional to the resistance. Coil 15 of the holding electromagnet, for example closing electromagnet 4 in FIG. 1, is supplied with current via transistor 16. A precision resistor 17 with considerably smaller resistance than that of the coil is connected in series with coil 15. A diode 18 serves as the freewheeling component. A voltage $U_I$ at junction 19 across precision resistor 17, which is proportional to the current flowing through coil 15, results when transistor 16 is activated, as well as when transistor 16 is turned off and current flows through diode 18, Voltage $U_I$ is conducted to a window comparator 20, the output 21 of which drops to zero as soon as voltage $U_I$ exceeds a first comparative voltage $U_{f1}$ at input 22. The level of this voltage can be used to preset the maximum current $I_{max}$ during the holding phase. When output 21 "drops to zero," transistor 16 is placed in the blocking state and current can only flow through freewheeling diode 18. As a result of the losses, the current then drops according to an e-function. This causes voltage $U_I$ at junction 19 to drop proportionally and to fall at some point below the lowest threshold voltage at input 23 of window comparator 20. This minimum threshold voltage presets the lowest current value $I_{min}$ during the clocking phase. By dropping below the threshold value for the voltage, output 21 of window comparator 20 changes to a high potential, which changes the condition of transistor 16 to conducting. As a result, the current through coil 15 rises again until it reaches current $I_{max}$ and the process repeats itself. If the output of window comparator 20 drops to zero again, a trailing-edge triggered monoflop 24 is started, which then sets its output 25 for a time $t_3$ to logic "1."

The above process is also shown time-oriented in FIGS. 4.1 to 4.5. FIG. 4.1 initially shows the voltage $U_I$ at junction 19, which is proportional to the current. At the point in time $t=0$, the voltage has reached first comparative voltage $U_{f1}$ at input 22. The output voltage of comparator 20 is shown in FIG. 4.2. As described before, the voltage at output 25 of monoflop 24 is set by the trailing edge to "1" for time interval $t_3$ (FIG. 4.3). This trailing edge will then trigger a second monoflop 26 that supplies a short pulse at its output 27 (FIG. 4.4), which ensures that the actual voltage at junction 19 is stored in a sample-and-hold module 28. This stored voltage is subtracted in a difference former 29 from threshold voltage $U_{f1}$ input 22, resulting in the desired voltage $\Delta U$ (FIG. 4.5), which is proportional to the previously described current $\Delta I$. Thus, as desired, a voltage proportional to the ohmic resistance R for the electromagnet is made available, which can then be transmitted as a signal to a control not shown here. Possible necessary corrections can be made there with a variance comparison.

If, for example, the holding electromagnet is energized with a constant current during the time when the armature is at rest relative to the electromagnet, for example during a portion of the holding phase, or if a constant measuring current is applied to the other electromagnet during a holding by one electromagnet, then the inductance effect is eliminated, as already explained. When adjusting one of the currents flowing through the two electromagnets with linear control to a constant value, the voltage at the coil of the respective electromagnet can be measured during this constant current phase. This results in a voltage proportional to the resistance, directly from the equation R=U/I. This voltage can then be stored temporarily for the next capturing process, for example in a capacitor, and can be used for the compensation.

Figure 5:
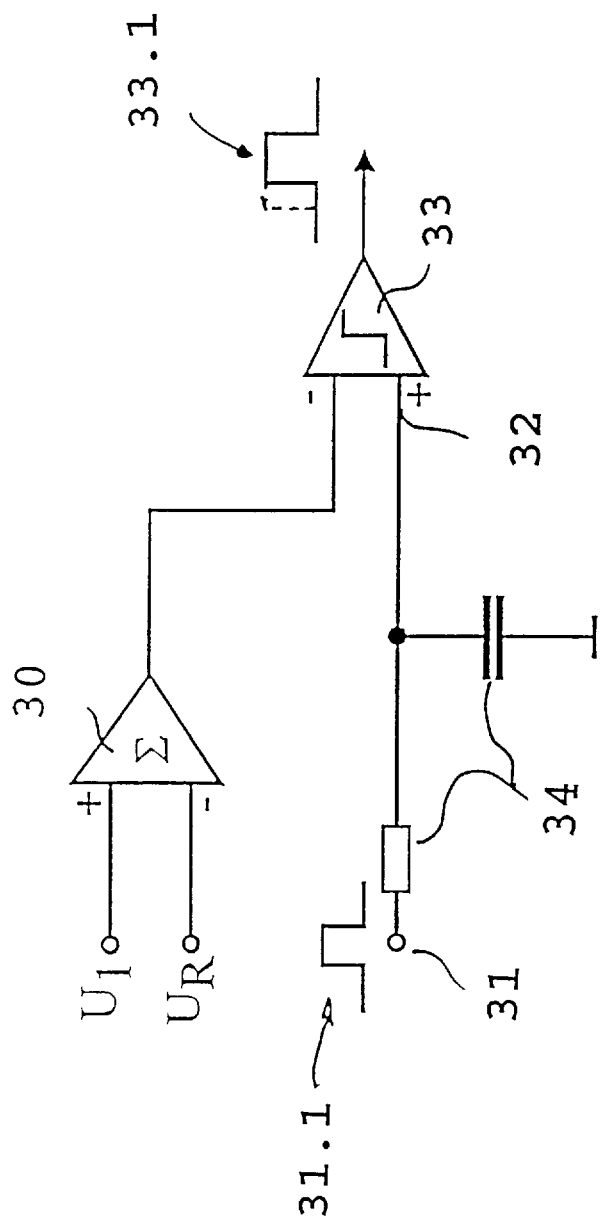
FIG. 5 is a circuit schematic for achieving a compensation for a changing ohmic resistance.

An example of a compensation circuit for this is displayed in FIG. 5. The stored voltage $U_R$, which is proportional to the resistance, is subtracted from a fixed voltage $U_1$ in a summing amplifier 30. Thus, the bigger the ohmic resistance at the electromagnet, the smaller the voltage at summing amplifier output 30. A signal 31.1 is then applied to input 31 of the total circuit, which is designed to enable the capturing current. As soon as signal 31.1 switches to level "1," a voltage forms at an input 32 of a comparator 33, but only slowly as a result of an RC link 34. The output of comparator 33 switches only if the voltage at input 32 is higher than the output voltage of summing amplifier 30. Thus, the higher the output voltage of summing amplifier 30, meaning the smaller the ohmic resistance of the coil, the later the output of comparator 33 switches. If this delayed output signal of comparator 33 is subsequently used to enable the capturing current, it results exactly in the desired effect, meaning that because of a lower ohmic resistance, the capturing current is enabled later in time, but it also rises faster due to the lower ohmic resistance, thus compensating for the effect of the resistance. A diagrammatic view of the resulting delay to signal 31.1, fed in at input 31, is shown above the output of comparator 33. The dashed leading pulse edge line represents the leading pulse edge, which is synchronized in time with the input signal, while the solid line for signal 33.1 shows the timely displacement of the output signal as compared to the input signal.

The voltage $U_1$, which is shown in FIG. 5, is preferably derived from the supply voltage. In that case, a voltage compensation is achieved in addition to the compensation of the temperature-dependent resistance changes. The higher the supply voltage $U_1$, the bigger the delay. This causes a later switching on of the capturing current, which is desirable with a higher voltage. For better dimensioning, it is useful to connect another summing amplifier in series, so that first the difference between the fixed voltages $U_1$ and $U_R$ is generated which, amplified by a variable factor, is then added to the additional voltage that depends on the supply voltage.

Figure 6:
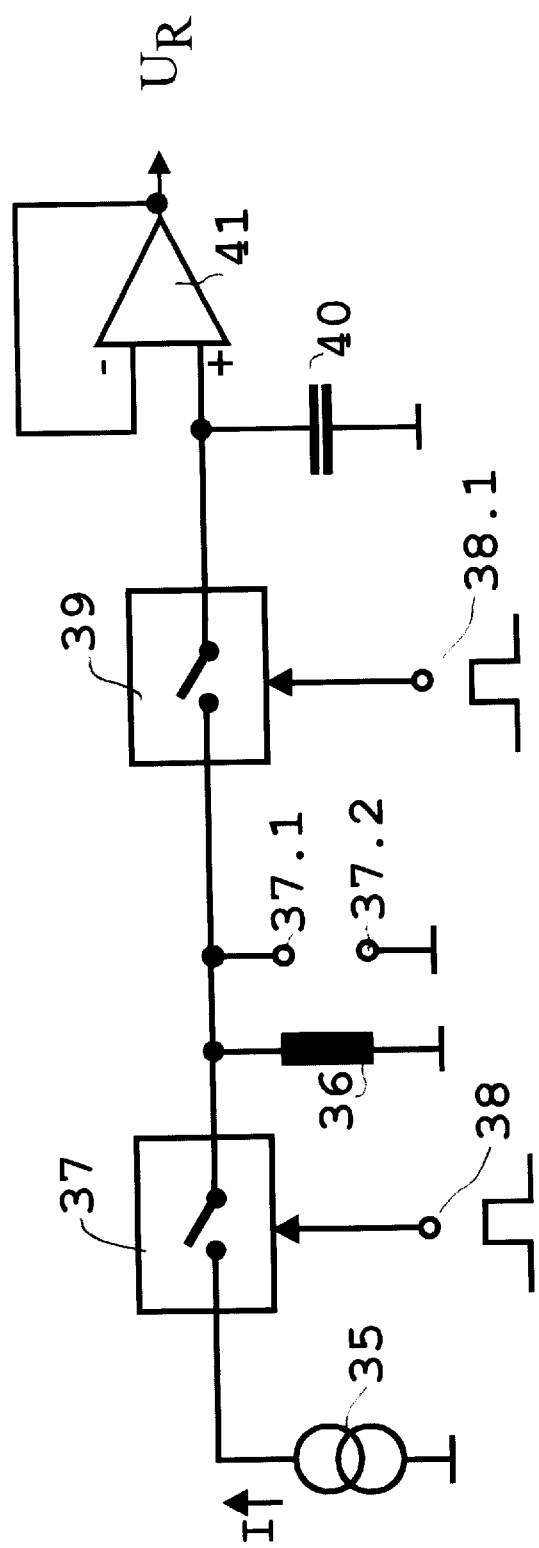
FIG. 6 is a circuit schematic for emerging the electromagnetic with a constant current.

The value for the ohmic resistance, determined with the methods described in the above, can be additionally used for diagnostic purposes. For example, it is possible to determine manufacturing tolerance ranges in the production of such electromagnetic actuators. It is also possible to determine the operating temperature by comparing the ohmic resistance of at least one of the electromagnetic actuators at an internal combustion engine in cold condition and the ohmic resistance measured during operation, so that it is possible to react with a warning signal or even through automatic reduction of the engine capacity if the temperature is too high. FIG. 6 shows a circuit to energize the electromagnet with a constant current during an operational period, where the armature is in a resting position relative to the electromagnet. This is done by a current source 35 which is applied to the coil of the magnet 36 via an electronical switch 37 which can be activated by a digital signal 38. The voltage across the coil 36 can be measured directly at the measuring point 37.1 versus the measuring point 37.2.

By a second electronically controlled switch 39 this voltage can be lead to a capacitor 40 which is followed by an operational amplifier (OP) 41. This OP is used as an impedance transformer to provide a very high input impedance, so that the voltage is stored in the capacitor after switching off the switch 39. The switch is activated by a digital signal 38.1 which may also be the same signal as signal 38.

The operation of the circuitry is as follows: If the magnet is in a resting position e.g. held on the second magnet, the circuitry is activated by closing of the switches. The digital control signal can be the same signal as the signal which controls the switching back to the holding current, that means the lower level of current at the second magnet. Then a current begins to flow through the coil 36 of the first magnet. After a short settling time the current remains constant and the voltage across the coil is a measure for the resistance of the coil (U=R*I) . Assuming that the digital signal 38.1 is identical to signal 38 the voltage across the coil is also effective for the capacitor. After switching off the digital signal, the voltage across the capacitor doesn't change until the next cycle. Thus, at the output voltage $U_R$ of the OP 41, a voltage proportional to the resistance of the coil is provided for the wanted correction purpose and can be fed into the input $U_R$ of FIG. 5.

Figure 7:
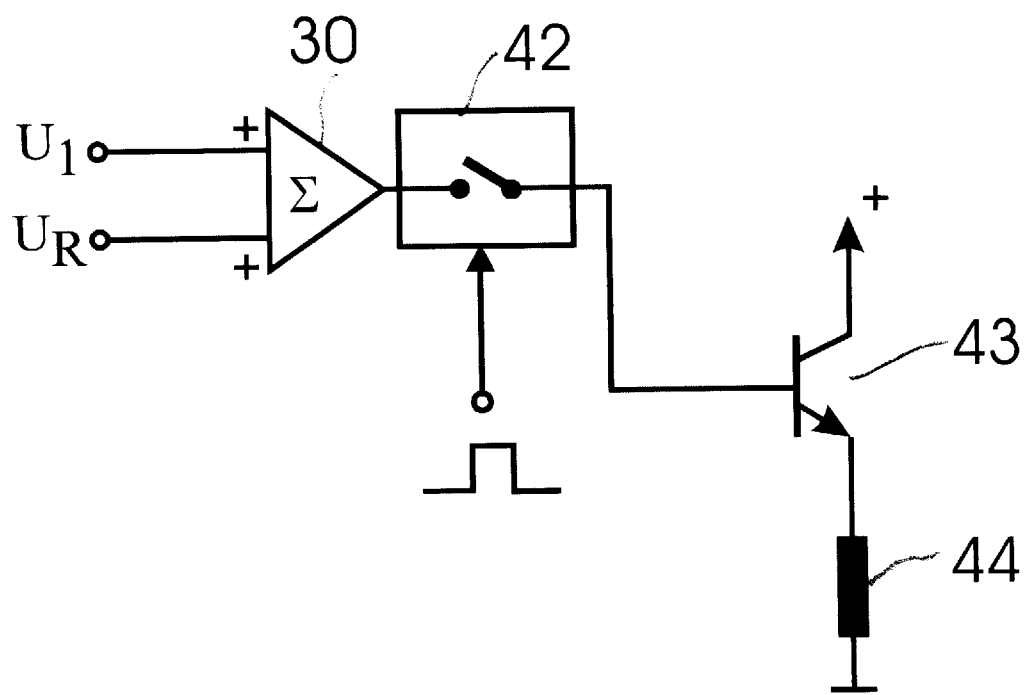
FIG. 7 is a circuit schematic for correcting a voltage parameter.

FIG. 7 shows additional to FIG. 5 another example for the correction of controllable parameters. Here the correction of the voltage level is shown. The function of the summing amplifier 30 is similar to FIG. 5. Except, that $U_1$ should not be derived directly from the supply voltage, but should be a constant voltage, e.g. stabilized by a conventional Zener diode. The other difference is, that the voltage $U_R$ is no longer subtracted but added to the voltage $U_1$.

The electronical switch 42 stands for the possibility to switch the catching current on and off. In the case of the switch 42 engaged, the output voltage of the summing amplifier 30 gets to the base of Transistor 43. The emitter voltage of the transistor 43 follows the voltage at the base. Thus, the coil of the magnet 44 is supplied with a voltage that is the higher, with measured resistance being accordingly higher. In this way the effect of the changing resistance is compensated.

The principle of correcting the other controllable parameters is similar so no additional explanation is included herein.

The invention has been described in detail with respect to preferred embodiments, and it will now be apparent from the foregoing to those skilled in the art that changes and modifications may be made without departing from the invention in its broader aspects, and the invention, therefore, as defined in the appended claims is intended to cover all such changes and modifications as fall within the true spirit of the invention.

What is claimed is:

1. A method for controlling an electromagnetic actuator having an electromagnet including a magnetic core presenting a pole face and an electromagnet coil wound around the magnetic core, a return spring and an armature connected to an actuation mechanism and movable toward the pole face by a magnetic force of the electromagnet against the force of the return spring, comprising the step of:

clocking a holding current at the electromagnet between an upper threshold $I_{max}$ and a lower threshold $I_{min}$ during an operational phase for holding the armature at the pole face of the electromagnet;

measuring a drop time of the current in the coil of the electromagnet at least once when the current drops from $I_{max}$ to $I_{min}$ while the armature is held against the electromagnet by the holding current; and deriving a value corresponding to ohmic resistance of the electromagnet coil from the measured drop time for use in compensating changes in the ohmic resistance of the electromagnetic coil.

2. The method according to claim 1, further comprising releasing the armature from the electromagnet by turning off the holding current; detecting one of a shut-down voltage and time behavior for one of voltage and current when the armature is released after the holding current is turned off; and deriving the inductance of the electromagnet from the detected one of the shut-down voltage and time behavior when the armature is released after the holding current is turned off.

* * * * *